United States Patent [19]

Rayburn

[11] 3,943,685

[45] Mar. 16, 1976

[54] MACHINE FOR LOADING ELECTRIC COMPONENTS INTO A CARRIER STRIP

[75] Inventor: Charles C. Rayburn, Mount Prospect, Ill.

[73] Assignee: Illinois Tool Works Inc., Chicago, Ill.

[22] Filed: July 19, 1974

[21] Appl. No.: 489,963

[52] U.S. Cl. .......................... 53/73; 53/167; 53/183
[51] Int. Cl.² .......................................... B65B 57/12
[58] Field of Search ......... 53/3, 29, 64, 73, 74, 167, 53/200, 183; 29/429, 430, 450, 451, 576 S, 25.42

[56] References Cited
UNITED STATES PATENTS

| | | | |
|---|---|---|---|
| 2,616,541 | 11/1952 | Smith | 53/64 X |
| 3,091,835 | 6/1963 | Weiss | 29/203 D X |
| 3,390,308 | 6/1968 | Marley | 29/576 S UX |
| 3,394,441 | 7/1968 | Weiss | 29/25.42 |
| 3,631,903 | 1/1972 | Huggins | 53/29 UX |

*Primary Examiner*—Willie G. Abercrombie
*Assistant Examiner*—Leon Gilden
*Attorney, Agent, or Firm*—Glenn W. Bowen; Robert W. Beart

[57] ABSTRACT

A loading machine and a method for loading small chip capacitors into apertures on an elongated plastic carrier strip are disclosed. The carrier strip is fed along a guide channel which supplies chip capacitors to a feed station. Below the feed station a punch punches apertures in the carrier strip and a gripper engages the strip to index it upwardly to the level of the feed station. A pusher arm at the feed station pushes each chip through the aperture in the carrier strip against a micrometer adjustment member behind the strip. A chip unloading machine is also disclosed in which a loaded carrier strip is fed through a guide channel to a pusher member which is cam operated under the control of an electrical timing mechanism that allows the pusher to push the chip capacitors out of their respective apertures at the proper time.

4 Claims, 10 Drawing Figures

MACHINE FOR LOADING ELECTRIC COMPONENTS INTO A CARRIER STRIP

BACKGROUND OF THE INVENTION

Small electrical components, for example ceramic chip capacitors having dimensions on the order of 0.2 inch in length and 0.05 inch in thickness or even smaller, are very difficult to handle during the processing, testing and storage operations that are required in the manufacture of such components. In order for a carrier system for such electrical components to be of general utility during these operations, there are a number of requirements which must be met by the system. These are as follows:

1. The cost of the carrier should be relatively low so that it may be treated as a disposable item.
2. Loading and unloading of the chip capacitors or similar components into the carrier must be accomplished by automatic machines for maximum efficiency.
3. The chip capacitors, when loaded onto the carrier, must be available for mechanized electrical testing and for inspection.
4. The electrical chip capacitors should not rub against each other in shipment.
5. The machine employed should be designed so that loading and unloading may be achieved with a minimization of mechanization investment and complexity.
6. The loading and unloading time should be as fast as possible, on the order of one-half second or less per chip capacitor.
7. The chip capacitors should be individually retained within the carrier so that inadvertent separation is prevented.

The chip capacitor loading and unloading system of the present invention has been designed to satisfy the above requirements. In addition, the machines used for loading the ribbon and for unloading the ribbon have been designed to achieve high speed operation at a relatively low investment cost.

DESCRIPTION OF THE DRAWINGS

The present invention is shown and described by reference to the following drawings in which.

TECHNICAL DESCRIPTION OF THE INVENTION

Figure 1:
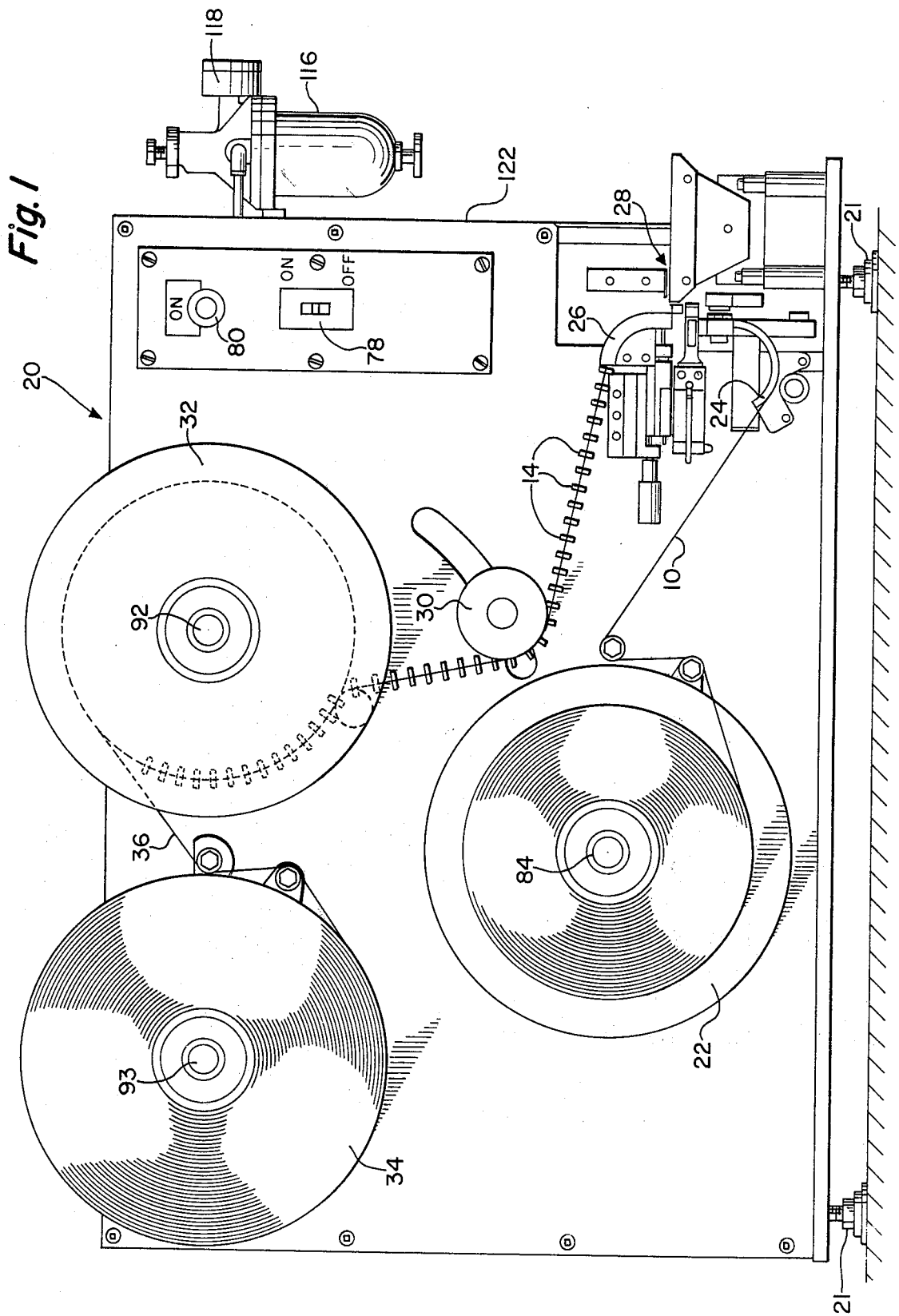
FIG. 1 is a front view of the loading machine of the present invention.
Figure 2:
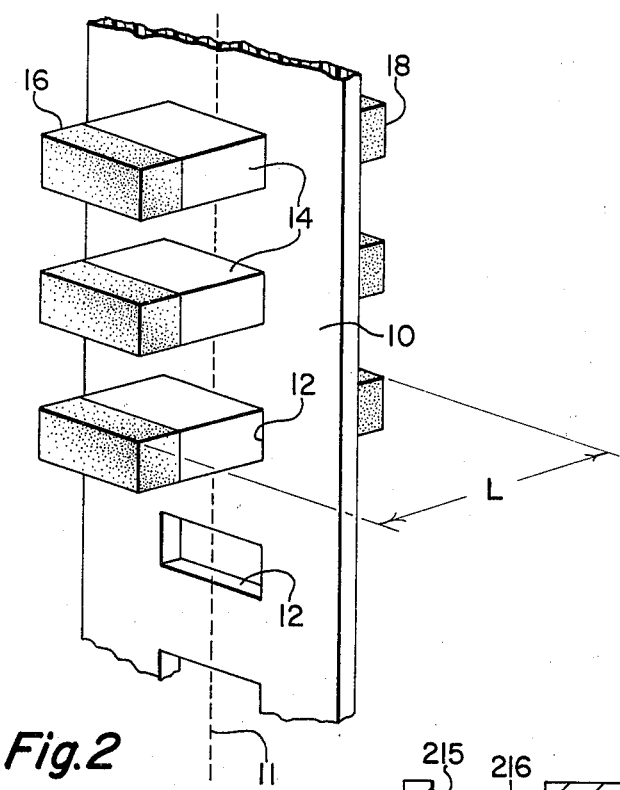
FIG. 2 is a perspective view of a plastic carrier strip loaded with chip capacitors.

An elongated thin carrier strip 10 of plastic or other suitable material, which has a longitudinal axis 11 and a plurality of apertures 12 punched in it for receiving electrical capacitors 14 or similar components, is shown in FIG. 2. The electrical chip capacitors are of a generally elongated shape and have electrode ends 16, 18. A typical chip capacitor may be on the order of 0.2 inch in length and 0.05 inch in thickness, although chip capacitors may be somewhat smaller or larger in accordance with the desired application. The rectangular apertures 12 that are punched into the tape 10 are somewhat smaller than the cross-sectional size of the chip capacitors 14; and, therefore, when a chip capacitor 14 is forced into the apertures 12, it will be retained in place in the position shown in FIG. 2 with the capacitor 14 being disposed in the center of the carrier strip 10 with its elongated dimension L directed in a generally normal direction to the longitudinal axis of the strip.

Details of the loading machine 20, which loads the chip capacitors 14 into the apertures 12 of the carrier strip 10 are shown in FIGS. 1 and 3 and FIGS. 5 through 9 of the drawings. The plastic carrier strip 10 is formed of a material, such as polyethylene, and may have a thickness on the order of 0.02 inch for chip capacitors of the size specified above. A strip 10, which is to be loaded with the chip capacitors 14, is withdrawn from a supply reel 22 and is passed around a lower guide member 24 and then through the feed station 28. The strip 10, after being loaded with chip capacitors, travels past the upper guide member 26 and the guide roller 30 to the take-up reel 32. A second supply reel 34 supplies a separator strip 36 of plastic or other suitable material, which is wound on the take-up reel 32 over the chip loaded tape 10.

Figure 3:
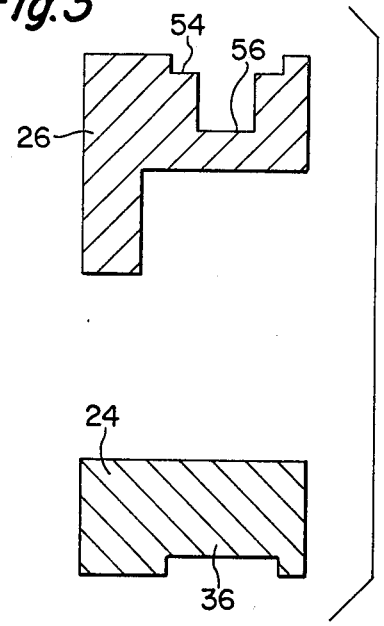
FIG. 3 is a cross-sectional view of the guide channels for the loading machine.

The carrier strip 10 in travelling to the feed station 28 first contacts the lower guide channel 24; a cross-sectional view of which is shown in FIG. 3. The guide channel 24 has a groove 36 on its bottom which is slightly wider than the width of the carrier strip 10 so that it can guide the strip in its upward path. The carrier strip 10 passes from the lower guide channel 24 to the punch 38 and the die 40 (FIG. 6), at which point the motion of the strip 10 is stopped and an aperture 12 is punched in it. After the area of the strip 10 in front of the punch 38 has been punched with an aperture 12, a gripper 42 is forced forward to grip the strip 10 between the gripper 42 and a back plate 44. The gripper finger 42 and the plate 44 are on an assembly which indexes the strip 10 upwardly so that the aperture 12 is in alignment with a feed track 46 in a vibrating feed table 48. The chip capacitors 14 are supplied in the track 46 with an orientation such that their elongated dimension is parallel to the length of the track. As the chips are fed one behind the other in the track 46, they reach the end of the track 46, one-by-one, where the end of the chip that is disposed away from the strip 10 is engaged by the end of a pusher finger 50. The pusher finger 50 is secured to a pusher arm 52 that moves so as to force the chip 14 into the aperture 12 in the strip 10 that is aligned with the chip 14 due to the previously mentioned indexing movement.

The strip 10, after leaving the feed station 28, travels around the upper guide channel 26 to the take-up reel 32. The upper guide channel 26 has the cross-section shown in FIG. 3 in which the upper portion of the guide has a groove 54 in its top which is wide enough to receive the strip 10 and is substantially of the same thickness. The groove 54 runs into a deeper slot 56 in the center of the guide channel 26. The slot 56 allows the elongated dimension of the chip capacitor 14 to project downwardly into it. The guide channel 26 has an opening 58 in it and a sensing finger 60 is positioned just behind the opening 58 and is biased forwardly by means of a resilient spring 62. The rear end of the sensing finger 60 is in contact with an actuating button 64 of an electrical switch 66 which is housed in a housing assembly 68. If a component 14 has not been fed into the opening 58 by the feed table 48, the switch 66 will not be actuated and this will provide a signal which will prevent the strip 10 from being indexed upwardly after the aperture 12 has been punched into it. In this manner, the strip 10 will not be fed forward with empty apertures so that maximum utilization of the carrier is achieved.

Since the chip capacitors 14 loaded by the loading machine 20 may have different lengths, it is necessary to be able to vary the position of the end of the sensing finger 60. However, because of the very small size of the chips, the location of the end of the finger 60 must be very accurately controlled to prevent chip breakage. In order to achieve this, a micrometer adjusting screw 70, which extends into threads in the block 72, is provided. A micrometer dial 74 is preferably supplied so that very precise location of the sensing finger 60 may be achieved.

Figure 5:
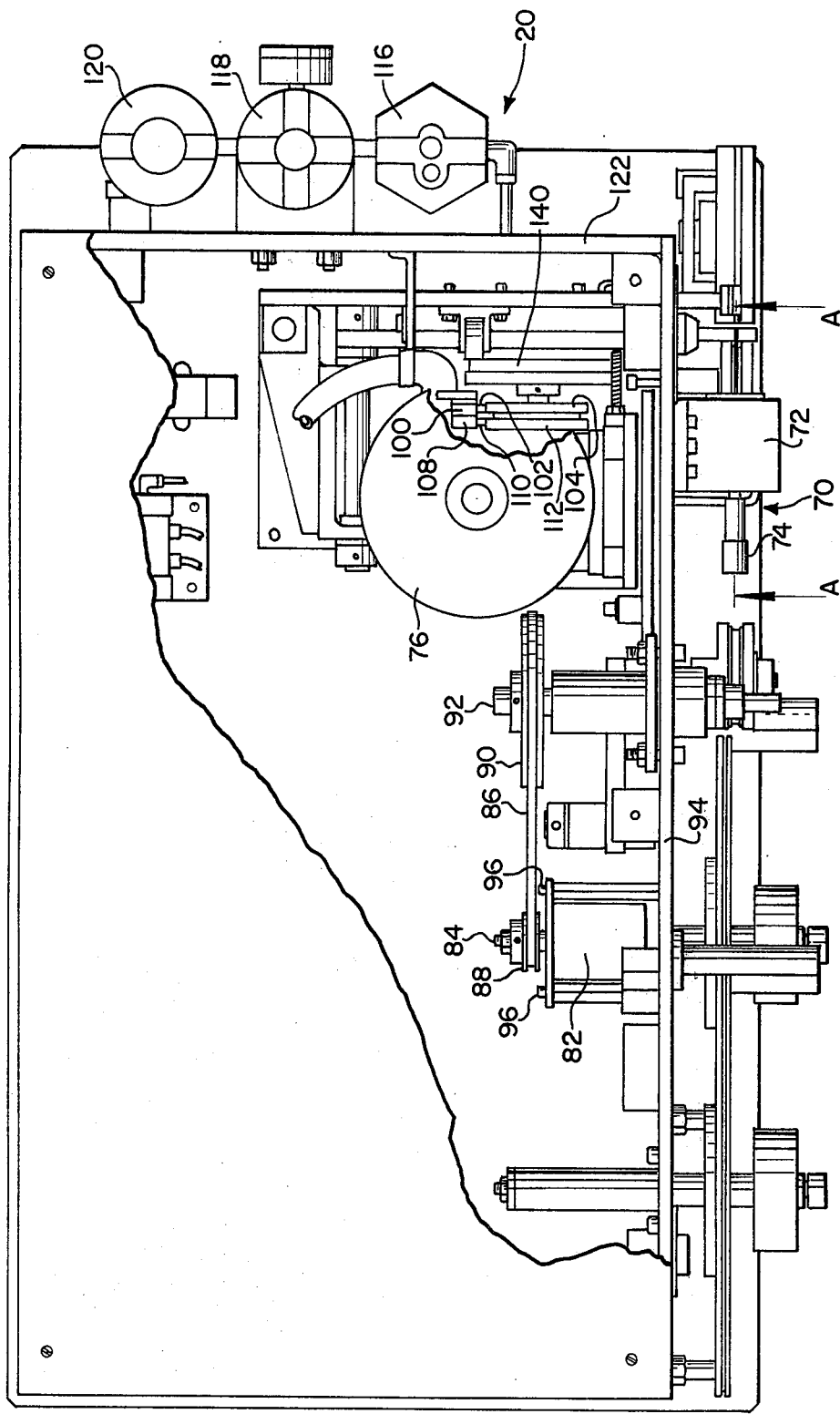
FIG. 5 is a top view of the loading machine of FIG. 2 with a portion of the housing removed so that the internal mechanism of the loading machine may be viewed.
Figure 6:
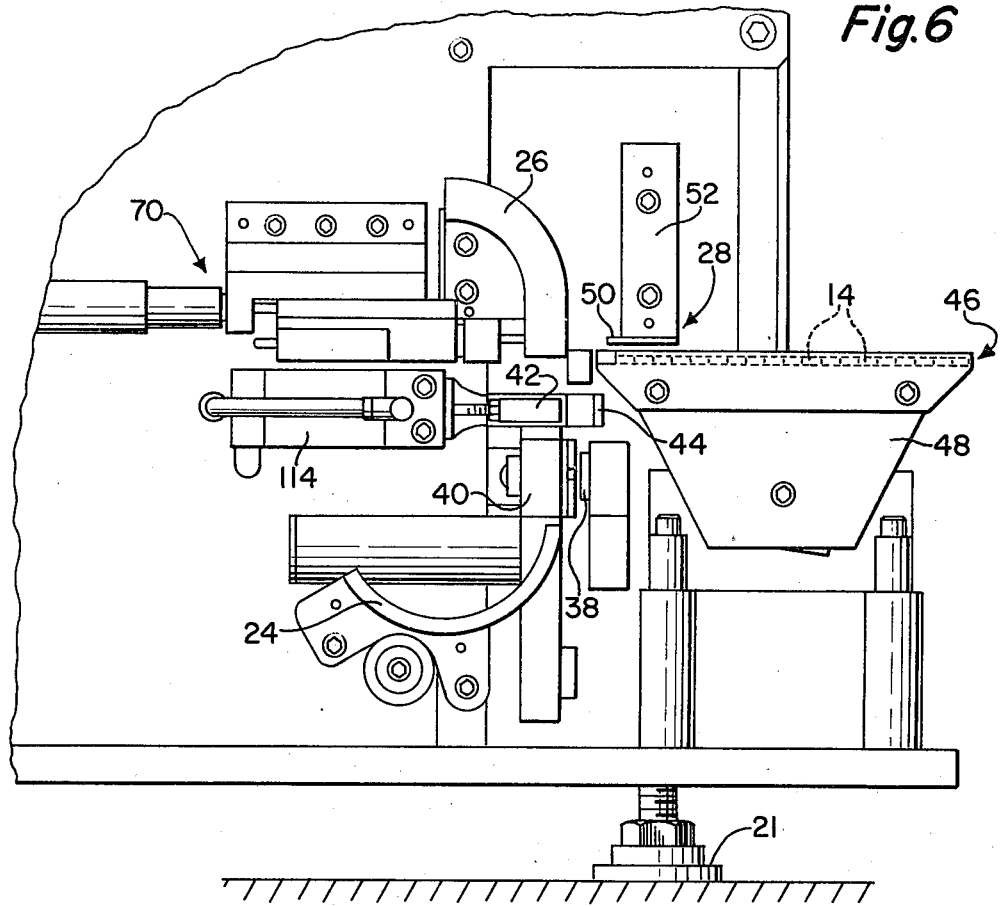
FIG. 6 is an enlarged view of the punching an loading portion of the loading machine of FIG. 1.

The loading machine 20 is under the control of cams which are driven by an electrical motor 76, which is best shown in FIG. 5. The entire loading machine 20 is supported by the feet 21 which are individually adjustable so that the machine may be leveled when placed on a non-level surface. The machine 20 is energized when the front panel "ON-OFF" switch 78 is energized, and an indicator light 80 indicates when the power to the loading machine 20 has been energized. A second much smaller motor 82 drives a shaft 84 for the supply roller 22. A drive belt 86 extends around a pulley 88 on the shaft 84 and a pulley 90 on the shaft 92 for the take-up reel 32. The separator strip supply reel 34 is not driven but rotates around the shaft 93. The motor 82 for driving the supply reel 22 is mounted to the wall 94 of the loading machine 20 by means of the bolts 96.

Timing for the different operations of the loading machine 20 is provided by cams that are driven by the motor 76. Punching of the apertures, for example, is controlled by the switch 100 (FIG. 5) which has an actuating button 102 that is actuated by the cam 104. When the switch 100 is actuated, an air cylinder 106 (FIG. 8) is energized to punch an aperture 12 in the carrier strip 10. A second switch 108, which has an actuator button 110 and is actuated by the cam 112, is utilized to actuate a second air cylinder 114 (FIG. 6) to force the gripper 42 forward to engage the strip 10 between the gripper 42 and the plate 44, as previously described. This operation requires, as a prerequisite, that the switch 66 be actuated due to the presence of a chip in the opening 58. The air cylinders 106, 114 of the loading machine 20 are preferably lubricated by a lubricating system consisting of a lubricator 116, a regulator 118 and a filter 120 for filtering the lubricants. These units are all mounted on the side wall 122 of the loading machine 20.

Figure 9:
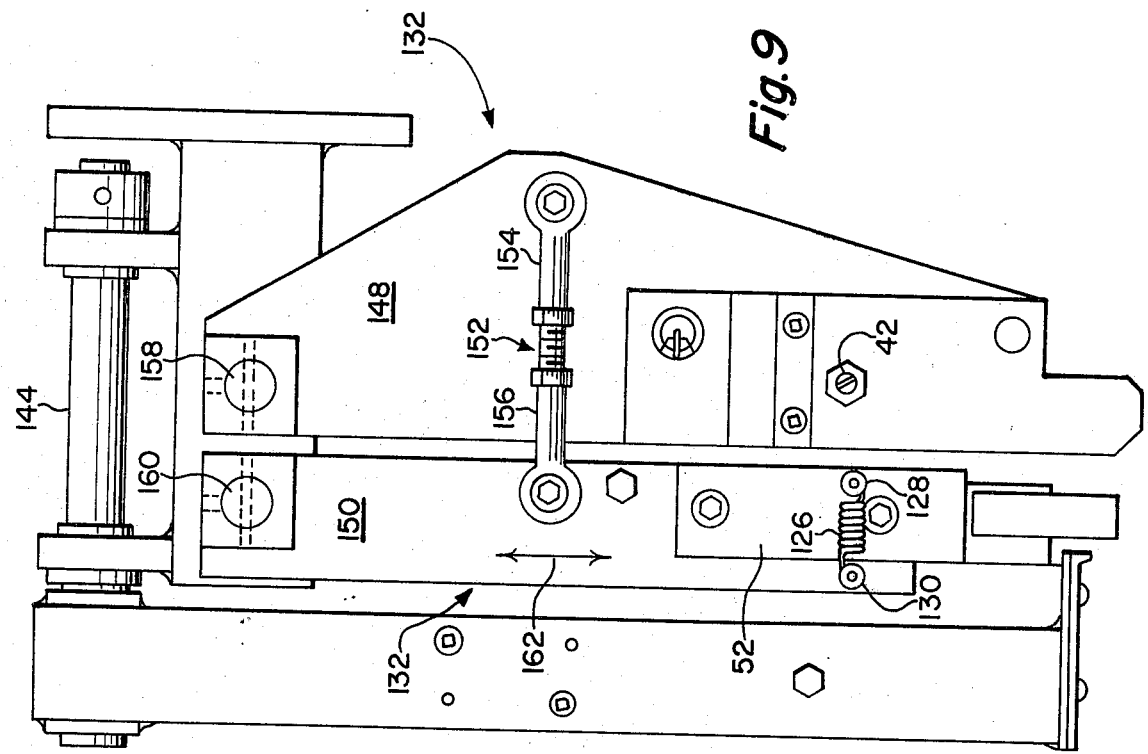
FIG. 9 is a front view of the pusher section of the loading machine of FIG. 1.
Figure 8:
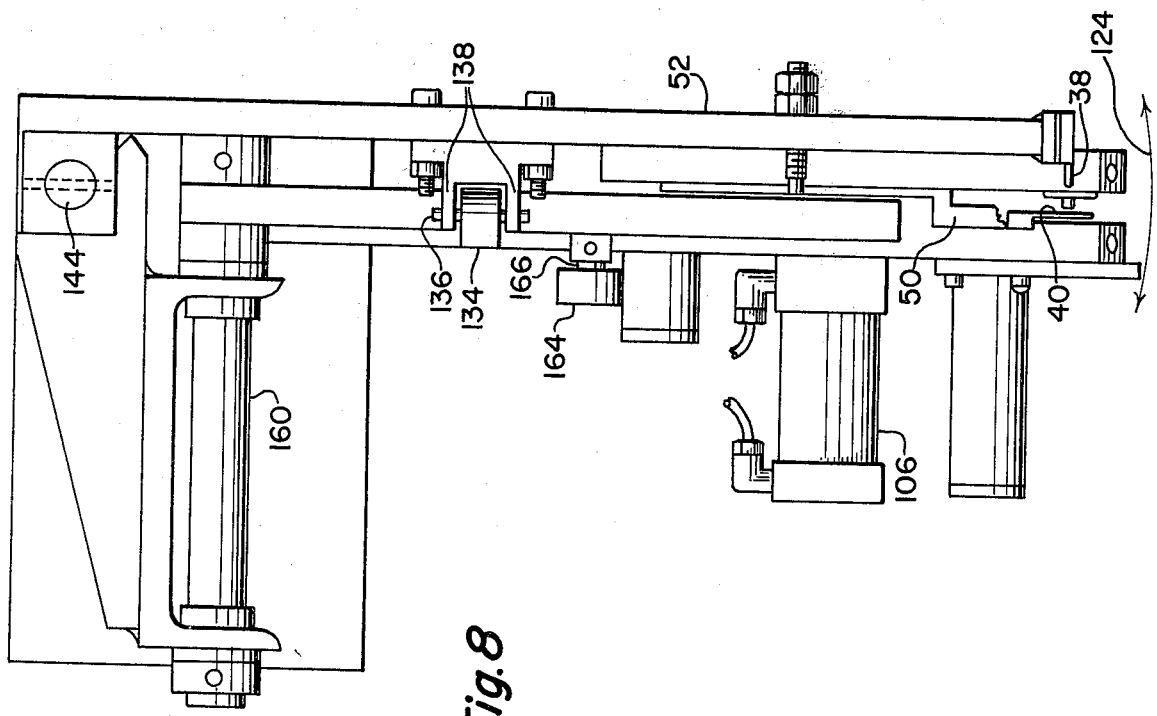
FIG. 8 shows a side view of the pusher mechanism of the loading machine for pushing the electrical chip capacitor into the carrier strip.
Figure 10:
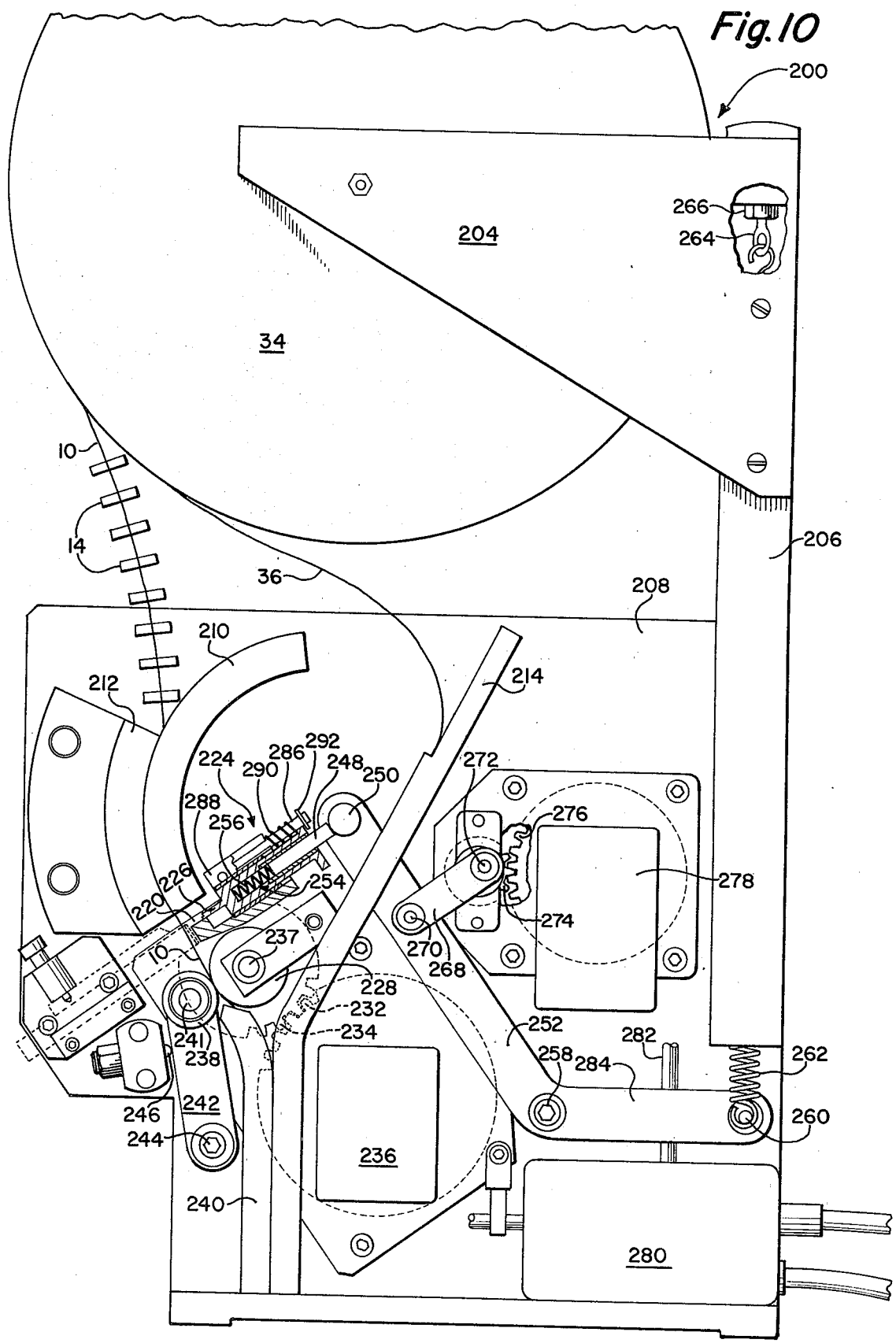
FIG. 10 is a front view of the unloading machine.

FIGS. 8 and 9 show in greater detail the pusher finger 50 on the pusher arm 52, which is utilized to push the chips 14 into the apertures 12 of the strip 10. The pusher finger 50 and the pusher arm 52 undergo a left and right motion, as represented by the arrow 124 in FIG. 8. The pusher finger 50 is spring loaded by means of a spring 126, which functions to prevent chip breakage. The spring 126 is connected to a spring post 128 on the pusher arm 52 and a post 130 on the elevator mechanism 132. Motion of the pusher arm 52 in the direction indicated by the arrow 124 is achieved by a cam follower 134 which is mounted on the shaft 136 in the yoke 138. The cam follower 134 interacts with the cam 140 (FIG. 5), which is driven by the motor 76 through a conventional drive system. The pivoting motion of the pusher arm 52 is obtained by movement of the pusher arm 52 about the shaft 144 due to the interaction of the cam 140 and the cam follower 134.

An elevator mechanism 132 is employed to index the strip 10 upwardly after a chip capacitor 14 has been loaded into an aperture 12. In order to index the carrier strip 10 upwardly when a component 14 is loaded into an aperture 12, the gripper 42 grips the strip 10 between it and the plate 44 and the elevator mechanism 132 is operated. The support members 148, 150 of the elevator assembly 132 are interconnected together by an adjustable turn buckle 152. The turn buckle 152 has a first arm 154, which is connected to the support member 148, and a second arm 156 which is connected to the support member 150. The elevator mechanism 132 undergoes up and down motion as indicated by the arrow 162. Control of the motion of the elevator mechanism 132 is achieved by means of the cam follower 164 which is on the shaft 166. The cam follower 164 interacts with the cam 168 (FIG. 5) to rotate the support members 146, 148 about the shafts 158, 160, respectively, to obtain the desired motion. The gripper 42 will be actuated only when the switch 66 has previously been actuated by the presence of the chip 14 in the opening 58.

As shown in FIG. 8, the motion of the pusher arm 52 about the shaft 144 causes the punch 38 to interact with the die 40 so that an aperture 12 is punched in the strip 10 for each new chip fed to the feed station 28. In addition, this motion insures that a chip is pushed into the aperture 12 after the strip 10 has been indexed upwardly. When the elevator mechanism 132 operates the gripper 42, which is secured to the support member 148, moves upwardly so as to index the carrier strip 10 upwardly to the level of the track 46. If a chip capacitor 14 is not present in the opening 58, the strip 10 will not be indexed upwardly even though the elevator mechanism 132 operates because the strip 10 will not be gripped between the gripper 42 and the plate 44 because the switch 66 will not be actuated by the sensing finger 60.

Figure 4:
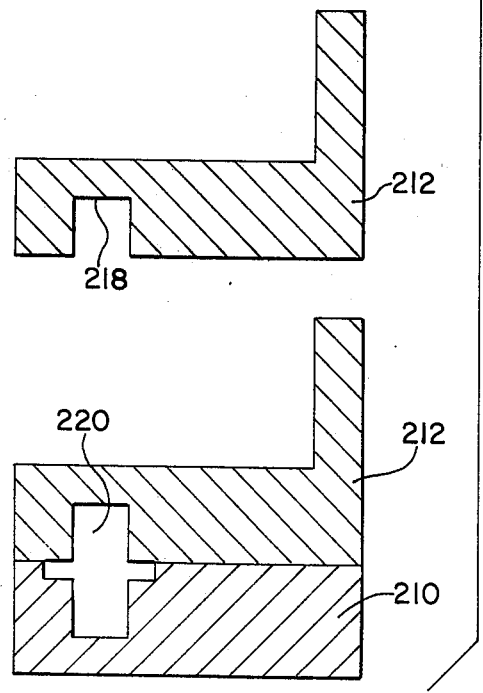
FIG. 4 is a cross-sectional view of the guide channels for the unloading machine.
Figure 7:
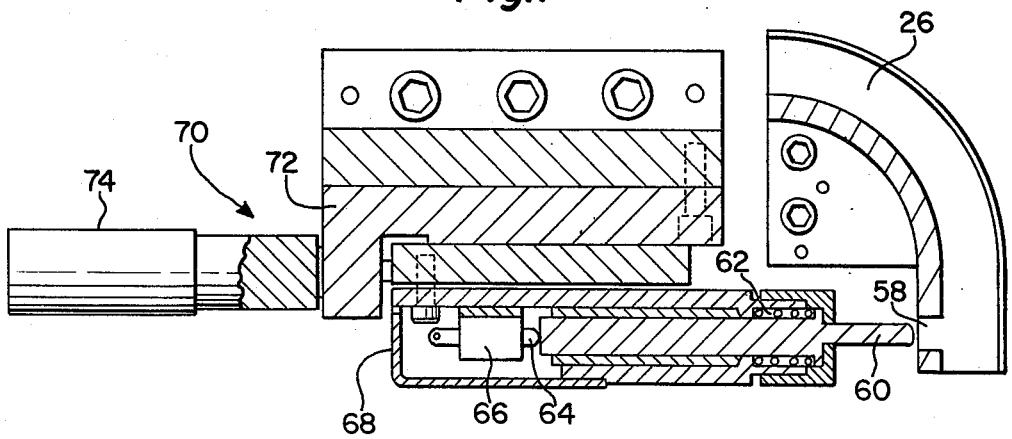
FIG. 7 is an enlarged cross-sectional view of the punching and loading portion of the loading machine taken along the lines A—A of FIG. 5.

A machine 200 for unloading the loaded carrier strip 10 is shown in FIG. 7 which supports the loaded take-up reel 32 from the loading machine 20 on a pair of support arms 204 at the top of a hollow elongated pipe 206 which is secured to a frame 208. The reel 32 is unwound so that the component-loaded strip 10 is fed downwardly between the guide channels 210, 212 while the separator strip 36 is fed to the guide channel 214. FIG. 4 shows a cross-sectional view of the guide channels 210, 212 with the guide channel 210 having a groove 215 in it which is slightly wider than the strip 10. The guide channel 210 has a deeper slot 216 in its center which mates with a deep slot 218 on the guide channel 212. When the guide channels 210, 212 are placed together, the slots 216, 218 and the groove 215 form a closed channel which allows the chip capacitors 214 and the carrier strip 10 to pass therethrough.

The carrier strip 10 is drawn between the guide channels 210, 212 by a driven roller 228 which is powered by an electric motor 236. The motor 236 drives a gear 232 which in turn drives a gear 234 that rotates on a shaft 237 which also supports the roller 228. The strip 10 is pulled between the driven roller 228 and an idler roller 238 which is supported on a shaft 240. The shaft 241 is mounted on an arm 242 that is pivotable about the point 244. An adjustable limit stop 246 is used to limit the movement of the arm 242. The drive roller 228 also bears against the surface of the separator strip 36 as it passes through the open guide channel 214 thereby driving it downwardly between the guide channels 214 and 240. As the strip 10 passes out of the guide channels 210, 212, the chips 14 are successively indexed against a plate 220 of a pusher mechanism 224. After a chip 14 has been indexed against the plate 220, a pusher finger 226 is forced downwardly against the end of the chip 14 so as to push it out of the aperture 12 in the strip 10, and the chip 14 is allowed to slide down a slide (not shown) to a recepticle. The carrier strip 10, after it is unloaded, and the separator strip 36 both exit from the guide channels 214, 240 at the bottom of the unloading machine 200.

The pusher mechanism 224 includes a plunger 248 which is driven by a cam follower 250 on the end of a bell crank 252 which drives the pusher finger 226 toward the loaded carrier strip 10. The forward end of the plunger 248 extends into a chamber 254 into which a coiled spring 256 is inserted for cushioning the impact of the plunger 248 as it is driven back and forth, and for imparting force from the plunger 248 to the pusher finger 226. The bell crank 252 is pivoted at the point 258, and the lower arm 284 of the bell crank 252 has a spring post 260 which receives the lower end of a spring 262. The spring 262 passes through the hollow pipe 206 and the upper end of the spring 262 is secured to an eyelet 264 that is held by a nut 266 to the top of the channel 206. A link 268 is secured at one end to the point 270 on the bell crank 252, and at the other end it receives a shaft 272 which carries an eccentric gear 274 which engages a gear 276 that is in turn driven by the electric motor 278, thereby driving the link 268. The motor 278, therefore, functions to operate the bell crank 252 when the unloading machine 200 is energized so as to continuously drive the pusher finger 246 towards and away from the loaded carrier strip 10.

The bell crank 252 will continue to oscillate in a continuous manner when the unloading machine 200 is energized and a control switch 280 is deactuated. Actuation of the switch 280 can be controlled by a timing mechanism or by an operator with a foot switch (not shown). If the switch 280 is actuated, the rod 282, which is connected to the lower arm 284 of the bell crank 252, will be in its downwardmost position; and, therefore, the lower arm 284 will also be pulled downwardly. This will cause the bell crank 252 to pivot in a clockwise direction about the pivot point 258 so that the cam follower 250 will be directed upwardly and to the right enough so it will no longer engage the plunger 248. When the lower arm 284 is pulled downwardly, it supplies tension to the spring 262. If the switch 280 is then again deactuated, the rod 282 will be forced upwardly by the spring 262 and the bell crank 252 will pivot about the point 258 in a counter-clockwise direction thereby forcing the cam follower 250 again into engagement with the plunger 248. Thus, when the switch 280 is deactuated, the pusher finger 226 will engage the end of each successive chip capacitor 14 that is fed in the strip 10 so as to push it out of its holding aperture 12, and actuation of the switch 280 will prevent the pusher finger 226 from engaging the chip capacitor 14.

The pusher mechanism 224 is constructed with an auxiliary shaft 286 which extends into a housing section 288. The shaft 286 is surrounded by a coiled spring 290 and the outer end of the shaft 286 has a washer 292 which is secured on it so as to hold the spring 290 on the shaft 286. The spring 290 returns the plunger 248 to its normal position following each depression of it due to the oscillating action of the bell crank 252.

The invention is claimed as follows:

1. A machine for loading small chip components having an elongated dimension into a thin carrier strip having a longitudinal axis comprising: supply means for supplying successive areas of said strip to a feed station, punch means at said feed station for successively punching an aperture into each of said areas of said strip which has a shape that corresponds to the shape of said components but is of a slightly smaller dimension, feed means for feeding a component towards said carrier strip at a location displaced from said punch means in a manner such that the elongated dimension of said component is substantially normal to the longitudinal axis of said carrier strip when said component is present, sensing means for sensing if a component has been fed toward said carrier strip, comprising a sensing finger and a micrometer screw means with a micrometer dial for accurately locating the position of said sensing finger with respect to said fed component, indexing means, gripping means coupled to said indexing means and operated by said sensing means for gripping said carrier strip only if said sensing means senses that a component has been fed by said feed means, said indexing means undergoing a motion such that said punched aperture will be aligned with said fed component after said indexing operation and displacement means for forcing said component into said aperture after said alignment has been achieved by said indexing means.

2. A machine as claimed in claim 1 comprising a guide member for guiding said carrier strip to said feed means wherein said guide member has an opening therein which is aligned with said sensing means and which allows said fed component to pass partially therethrough into contact with said sensing means.

3. A machine as claimed in claim 1 wherein said feed means is a vibrating feed table comprising an elongated feed track in alignment with said opening in said guide member which contains a plurality of components in said track which are aligned one-by-one in a line with their elongated dimensions parallel to each other.

4. A machine as claimed in claim 3 comprising a guide member for guiding said carrier strip to said feed means wherein said guide member has an opening therein which is aligned with said sensing means and which allows said fed component to pass partially therethrough into contact with said sensing means.

* * * * *